United States Patent [19]

Price, Jr.

[11] 4,295,063
[45] Oct. 13, 1981

[54] FAST SETTLING DIGITAL TO ANALOG CONVERTER BIT SWITCH

[75] Inventor: John J. Price, Jr., Mesa, Ariz.

[73] Assignee: Motorola Inc., Schaumburg, Ill.

[21] Appl. No.: 53,131

[22] Filed: Jun. 28, 1979

[51] Int. Cl.³ .................... H03K 5/153; H03K 17/02
[52] U.S. Cl. .................................. 307/362; 307/542; 330/252
[58] Field of Search ......... 307/300, 350, 362, DIG. 3, 307/254, 255, 214, 203, 237; 330/252; 340/347 AD, 347 M

[56] References Cited

U.S. PATENT DOCUMENTS 3,619,797 11/1971 Merrick .............................. 330/252
4,088,905 5/1978 Comer .............................. 307/362 X Primary Examiner—John Zazworsky
Attorney, Agent, or Firm—Charles R. Lewis

[57] ABSTRACT

A bit switch for use in a digital-to-analog converter comprises three differential pairs of transistors. The first pair receives a digital input signal and a reference voltage signal. The second pair switches the bit current to either an output bus or to ground depending upon the state of the input signal. A third differential pair of transistors is coupled between the first and second pairs for minimizing adverse effects of fast input transitions and parasitic capacitance.

2 Claims, 2 Drawing Figures

FAST SETTLING DIGITAL TO ANALOG CONVERTER BIT SWITCH

BACKGROUND OF THE INVENTION

1. Field of the Invention

This invention relates generally to digital-to-analog converters and, more particularly, to an improved bit switch for use in conjunction with the ladder network in a digital-to-analog converter (DAC).

2. Description of the Prior Art

Digital to analog converters which include a ladder network may employ a plurality of bit switches for switching a binary scaled bit current ($I_{Bit}$) to an output bus or to ground depending upon the state of an input signal. That is, when the bit switch is turned on, it directs a pre-determined binary scaled current onto the output bus. Bit currents from the bit switches are then summed on the output bus to form an analog signal corresponding to the digital input signal.

One known type of bit switch includes a first differential transistor pair which receive an input signal and a reference voltage, and a second differential pair which switches the bit current between the output bus and ground. However, when using this arrangement, a rapid change in the input level is coupled through the base-collector capacitance of the input transistor of the first differential pair and affects the voltage at the base of one of the transistors in the second differential pair. Thus, the voltages at the bases of the second differential pair are not precisely differential voltages. This causes a glitch at the emitters of the second differential pair which, especially in the case of low bit currents, may take a considerable amount of time to settle out.

SUMMARY OF THE INVENTION

It is an object of the present invention to provide an improved DAC bit switch.

It is a further object of the invention to provide an improved DAC bit switch which eliminates most of the common mode signal coming from the input differential stage.

According to a broad aspect of the invention there is provided a current bit switch for use in a digital to analog converter for directing a bit current generated by first current source to an output bus, comprising: a first differential pair of switching devices for receiving a reference voltage and a digital input signal, said digital input signal capable of assuming first and second states; a second differential pair of switching devices for directing said bit current onto said output bus when said input signal is in said first state; and a third differential pair of switching devices having an input coupled to said first pair and having an output coupled to said second pair for reducing overshoot caused by fast transitions of said input signals between said first and second states.

The above and other objects, features and advantages of the present invention will be more clearly understood from the following detailed description taken in conjunction with the accompanying drawings, in which:

DESCRIPTION OF THE PREFERRED EMBODIMENT

Figure 1:
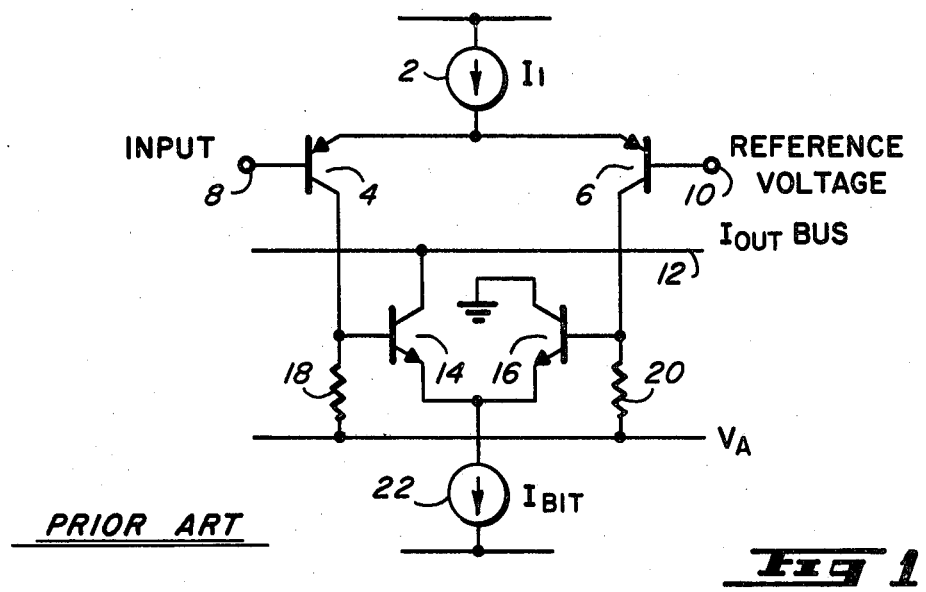
FIG. 1 is a schematic diagram of a DAC bit switch in accordance with the prior art.

Referring to FIG. 1, there is shown a bit switch according to the prior art. A first differential pair comprises emitter coupled PNP transistors 4 and 6. The base of transistor 4 is coupled to input terminal 8, and the base of transistor 6 receives a reference voltage at terminal 10. If the bit switch is to be TTL compatible, the reference voltage would be approximately 1.4 volts. The emitters of transistors 4 and 6 receive a current $I_1$ from current source 2.

A second differential pair comprises NPN emitter coupled transistors 14 and 16. The base of transistor 14 is coupled to the collector of transistor 4, and the base of transistor 16 is coupled to the collector of transistor 6. The collector of transistor 14 is coupled to an output bus 12, and the collector of transistor 16 is coupled to ground (or, if desired, to a second output bus). The emitters of transistors 14 and 16 are coupled to current source 22 which supplies a binary scaled bit current ($I_{Bit}$). Resistors 18 and 20 are coupled between a source of supply voltage $V_A$ and the bases of transistors 14 and 16 respectively.

The amount of current supplied by source 2 ($I_1$) need only be large enough to supply a voltage drop across resistors 18 and 20 sufficient to cause differential pair 14 and 16 to switch.

The circuit of FIG. 1 is configured so as to apply the bit current $I_{Bit}$ to output bus 12 when a logical 0 is applied to input terminal 8. That is, with a logical 0 at its base, transistor 4 is turned on causing a voltage to appear at the base of transistor 14 equivalent to $V_A$ plus the voltage drop in resistor 18 caused by current $I_1$. This turns transistor 14 on, thus providing a path for the bit current to the output bus 12. On the other hand, with a logical 1 applied to its base, transistor 4 is off. Current $I_1$ will flow through transistor 6 producing a base voltage at transistor 16 which turns transistor 16 on. In this case, the bit current has a completed path to ground.

A problem with this circuit appears when a high speed transition occurs at input terminal 8. Input PNP transistor 4 is very slow and exhibits a high parasitic capacitance. Additionally, parasitic capacitance appears at the emitters of transistors 14 and 16. When, for example, the input at terminal 8 quickly changes from a low to a high state, the voltage at the base of transistor 14 should fall and the voltage at the base of transistor 16 should rise. However, a momentary capacitive glitch through the parasitic capacitance of transistor 4 will cause the voltage at the base of transistor 14 to rise. The voltage at the base of transistor 16, however, remains stable. Therefore, the voltages at the bases of transistor 14 and 16 are not symmetrical. This will cause the voltage at the common emitters of transistors 14 and 16 to vary, and due to the relatively low bit current (e.g. on the order of 1 microamp) a substantial amount of time (e.g. 1 microsecond) will be necessary to discharge the parasitic capacitance and stabilize the voltage at the emitters of transistors 14 and 16.

Figure 2:
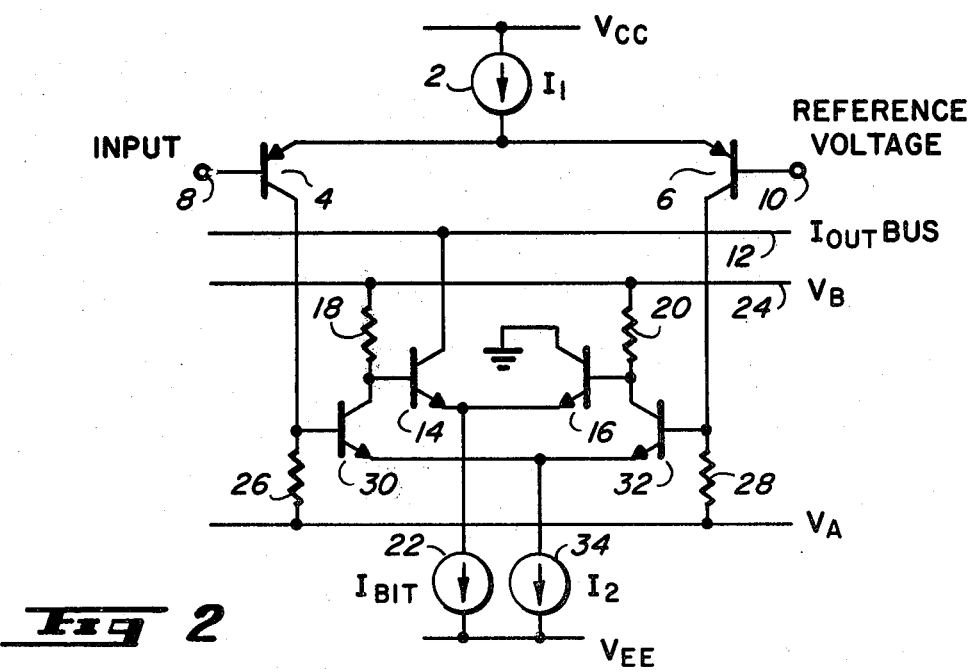
FIG. 2 is a schematic diagram of the inventive DAC bit switch.

The inventive circuit shown in FIG. 2 enables the voltage at the common emitters of transistors 14 and 16 to be maintained relatively constant. The two differential pairs which appear in the prior art circuit of FIG. 1 also appear in the inventive circuit shown as FIG. 2. These comprise PNP transistors 4 and 6 and NPN transistors 14 and 16. Resistors 26 and 28 in FIG. 2 function in the same manner as do resistors 18 and 20 in FIG. 1.

The circuit of FIG. 2, however, includes an additional differential pair comprised of NPN transistors 30 and 32 coupled in a common emitter configuration. The bases of transistors 30 and 32 are coupled to the collectors of transistors 4 and 6 respectively and to $V_A$ (approximately 1.4 volts above $V_{EE}$) via resistors 26 and 28. The collector of transistor 30 is coupled to the base of transistor 14 and to a supply voltage $V_B$ (approximately 8 volts above VEE) via resistor 18. Similarly, the collector of transistor 32 is coupled to the base of transistor 16 and to supply line 24 ($V_B$) via resistor 20.

An additional current source 34 ($I_2$) is coupled to the emitters of transistors 30 and 32. Resistors 18 and 20 may typically have a value of 5 K ohms and current sources 2 and 34 generate currents $I_1$ and $I_2$ of, for example, 50-200 microamps.

As should be obvious, the glitch which appeared at the base of transistor 14 in FIG. 1 as a result of the parasitic capacitance will also appear at the base of transistor 30. However, due to the buffering by transistors 30 and 32 between the input differential pair and the bit current switching differential pair, it is no longer necessary to discharge parasitic capacitance at the emitters of transistors 14 and 16 and there will be an immediate response by transistor 14 to the base drive produced at the collector of transistor 30. Furthermore, since $I_2$ is substantially greater than the bit current at the lower end of the ladder network, any parasitic capacitance at the common emitters of transistors 30 and 32 will be quickly discharged. Thus, the inventive DAC bit switch eliminates a substantial amount of the common mode signal coming from the PNP input differential stage. Therefore, the emitters of transistors 14 and 16 remain at a relatively constant voltage requiring little time to settle out.

The above description of a preferred embodiment is given by way of example only. Changes in the form and details may be made by one skilled in the art without departing from the spirit and scope of the invention as defined by the appended claims.

I claim:

1. A current bit switch for use in a digital to analog converter for directing a bit current generated by a first current source to an output bus, comprising:
   a first differential pair of switching devices for receiving a reference voltage and a digital input signal, said digital input signal capable of assuming first and second states;
   a second differential pair of switching devices for directing said bit current onto said output bus when said input signal is in said first state;
   a third differential pair of switching devices having an input coupled to said first pair and having an output coupled to said second pair for reducing overshoot caused by fast transitions of said input signals between said first and second states,
   a second current source for supplying current to said first pair of switching devices; and a third current source coupled to said third pair of switching devices,
   said first differential pair of switching devices comprising first and second emitter coupled transistors, said first transistor having a base coupled to said input signal and having a collector coupled to said third differential pair and said second transistor having a base coupled to a reference voltage and a collector coupled to said third differential pair,
   said third differential pair comprising third and fourth emitter coupled transistors, the base of said third transistor coupled to the collector of said first transistor and to a first source of supply voltage and the collector of said third transistor coupled to a second source of supply voltage, the base of said fourth transistor coupled to the collector of said second transistor and to said first source of supply voltage and the collector of said fourth transistor coupled to said second source of supply voltage, the common emitters of said third and fourth transistors coupled to said third current source, and
   said second differential pair comprising fifth and sixth emitter coupled transistors, said fifth transistor having a base coupled to the collector of said third transistor and to said second source of supply voltage and having a collector coupled to said output bus, and said sixth transistor having a base coupled to the collector of said fourth transistor and to said second source of supply and having a collector coupled to ground, the emitters of said fifth and sixth transistors coupled to said first current source, and
   said first and second transistors being PNP transistors and said third, fourth, fifth and sixth transistors being NPN transistors.

2. A current bit switch according to claim 1 wherein said second and third current sources each generate currents from 50-200 microamperes.

* * * * *